United States Patent
Yater et al.

(10) Patent No.: US 8,431,471 B2
(45) Date of Patent: Apr. 30, 2013

(54) METHOD FOR INTEGRATING A NON-VOLATILE MEMORY (NVM)

(75) Inventors: Jane A. Yater, Austin, TX (US); Sung-Taeg Kang, Austin, TX (US); Mehul D. Shroff, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 187 days.

(21) Appl. No.: 12/951,862

(22) Filed: Nov. 22, 2010

(65) Prior Publication Data

US 2012/0126309 A1    May 24, 2012

(51) Int. Cl.
*H01L 21/3205*  (2006.01)
*H01L 21/4763*  (2006.01)

(52) U.S. Cl.
USPC .................. 438/591; 257/326; 257/E21.192

(58) Field of Classification Search .................. 438/591; 257/326, E21.192, E29.17
See application file for complete search history.

(56) References Cited

U.S. PATENT DOCUMENTS

| | | | |
|---|---|---|---|
| 7,371,626 B2 | 5/2008 | Chindalore | |
| 2008/0261367 A1* | 10/2008 | Prinz et al. | 438/275 |
| 2009/0191700 A1* | 7/2009 | Nakagawa | 438/593 |

* cited by examiner

*Primary Examiner* — Phuc Dang
(74) *Attorney, Agent, or Firm* — James L. Cingan, Jr.; Joanna G. Chiu

(57) ABSTRACT

A feature is formed in the NVM isolation region during the patterning and etching of an NVM device and a logic device such that the feature is of substantially equal height to the logic device and is well-defined so that it does not cause defect signals. A first conductive layer is formed over a substrate. The first conductive layer is patterned to expose at least a portion of the substrate in an NVM region and at least a portion of an isolation region. An NVM dielectric stack is formed over the first conductive layer, the exposed substrate, and the exposed isolation region, and a second conductive layer is formed over the NVM dielectric stack. The first and second conductive layers and the NVM dielectric stack are patterned to form a first gate and a second gate of an NVM cell in the NVM region and a feature over the isolation region. The feature comprises a portion of the first conductive layer, a portion of the NVM dielectric stack adjacent a first sidewall of the portion of the first conductive layer, and a portion of the second conductive layer adjacent the portion of the NVM dielectric stack.

15 Claims, 13 Drawing Sheets

METHOD FOR INTEGRATING A NON-VOLATILE MEMORY (NVM)

BACKGROUND

1. Field

This disclosure relates generally to non-volatile memories (NVMs), and more specifically, to integration of a non-volatile memory in an integrated circuit.

2. Related Art

Non-volatile memory (NVM) cells, as is typical of memories generally, are formed in a manner that can be integrated with other circuitry. Even in the case of a stand-alone NVM, there is still other circuitry than just an array of NVM cells. The processes used in making the NVM cells must allow for the making of other circuit types such as other transistor types or passive elements. This integration of NVM cells with other circuit elements can result in issues that are beneficially eliminated or reduced. Also the particular type of NVM cell can result in issues not present with other NVM cells when integrating with other circuit elements. This may result in choosing a lesser NVM cell for a particular design due to difficulties arising from integrating with the other circuit elements with the better NVM cell.

Accordingly, there is a need for improving upon the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, an NVM cell is made in conjunction with another circuit element that utilizes some of the same process steps utilized in making the NVM cell. During an etch of a second polysilicon layer over a first polysilicon layer, at an interface between an array area and a logic area, the etch results in a repeatable structure that is also regular in shape. This results in automatic defect detectors identifying the repeatable structure as an intentional structure and not as a defect. Also the repeatable structure is only the height of the first polysilicon layer which results in subsequent etches of the first polysilicon layer in forming the devices in the logic area not requiring a high thickness of photoresist over the repeatable structure and thus improving the function of the photoresist. This is better understood by reference to the drawings and the following description.

Figure 1:
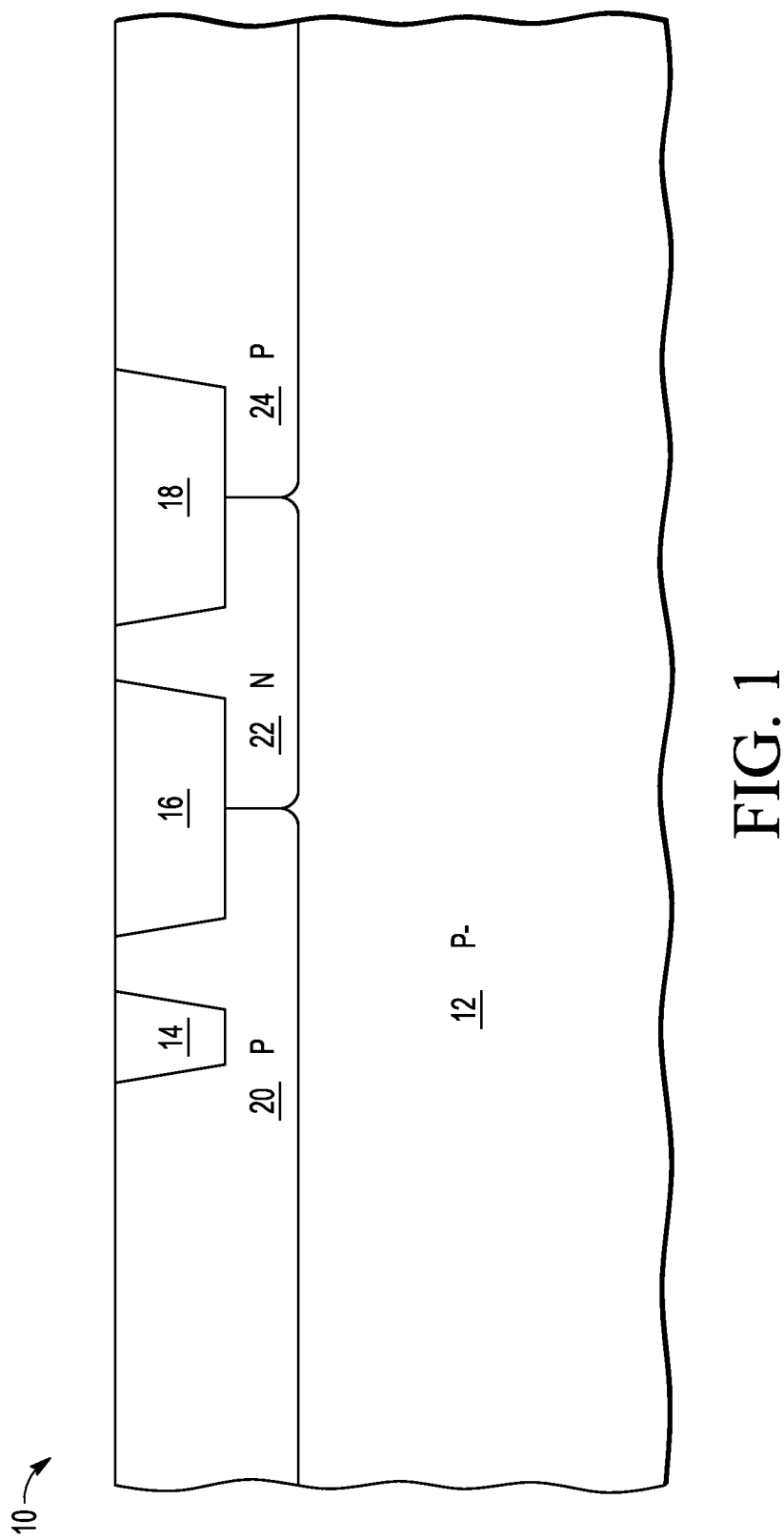
FIG. 1 is a device structure at a stage in processing according to an embodiment.

Shown in FIG. 1 is a device structure 10 having a semiconductor substrate 12 with a background doping of p type, a well region 20 formed in substrate 12 doped to p type with a higher concentration than the background doping of substrate 12, a well region 22 formed in substrate 12 adjacent to well region 20 doped to n type, a well region 24 adjacent to well region 22 doped to p type with a higher concentration than the background doping, an isolation region 14 in well region 20, an isolation region 16 in well regions 20 and 22, and an isolation region 18 in well regions 22 and 24. Well region 20 is for a non-volatile memory (NVM) array. Well region 24 is for forming a circuit element, such as a transistor, that is not part of the NVM array. Well region 22, in addition to isolation regions 16 and 18, is for aiding isolation between well region 20 and well region 24. It may be noted that well region 20 may be further isolated from substrate 12 by a well region doped to n type and located below well region 20. Isolation means electrical isolation. With substrate 12 being doped to p type with well regions formed therein, the p-doped portion of substrate 12 is what is isolated. The well regions are part of the substrate but not necessarily electrically coupled to the portion of the substrate that is doped to p type. Isolation regions are formed in substrate 12 and are part of the substrate but function to isolate wells or the regular background doped portion of the substrate from other regions in or over the substrate.

Figure 2:
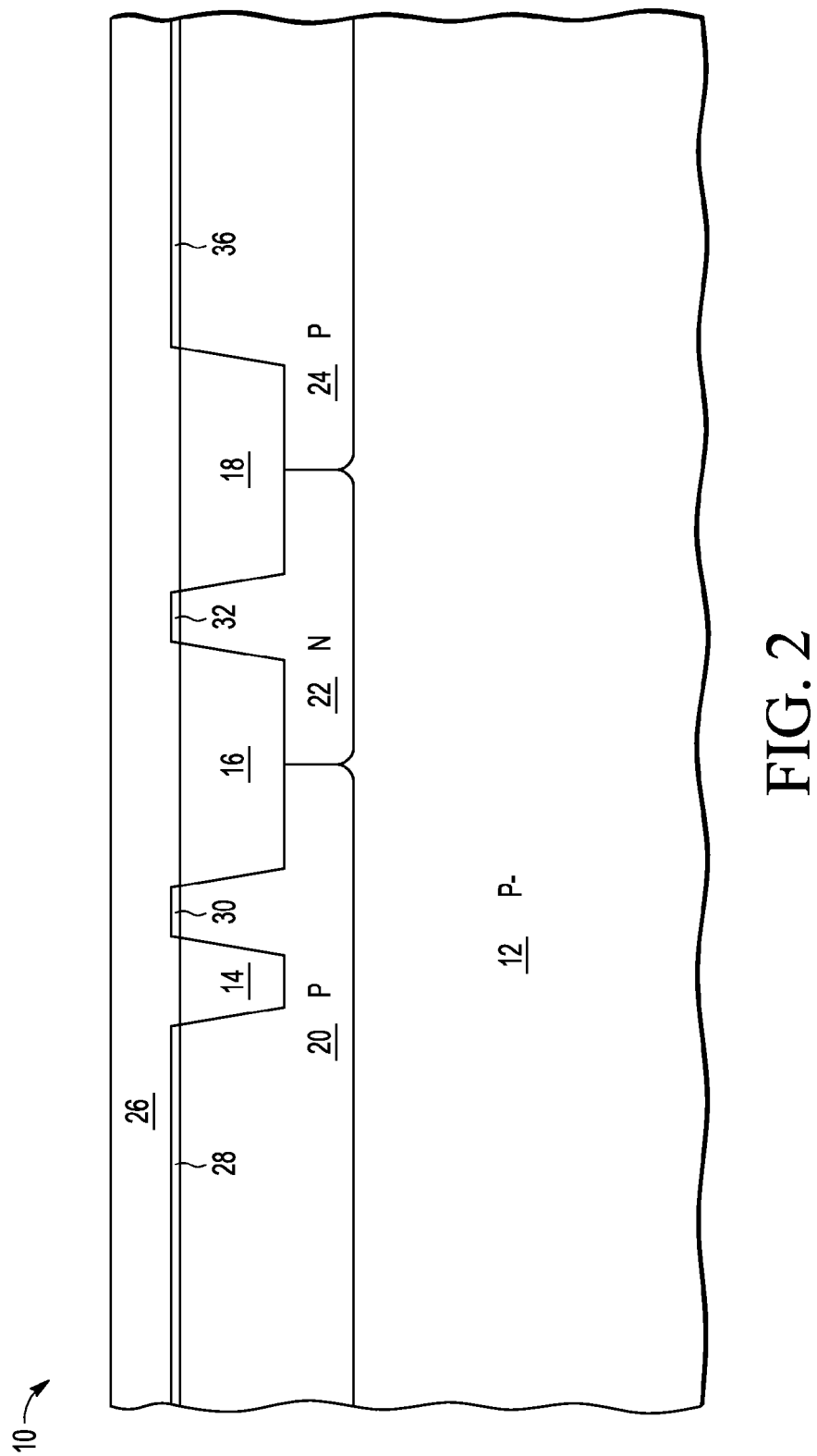
FIG. 2 is the device structure of FIG. 1 at a subsequent stage in processing.

Shown in FIG. 2 is device structure after forming a dielectric 28 on well region 20, a dielectric 30 on well region 20 between isolation regions 14 and 16, a dielectric 32 on well region 22, a dielectric 36 on well region 24, and a conductive layer 26 formed on dielectrics 28, 30, 32, and 34 and isolation regions 14, 16, and 18. Dielectrics 28, 30, 32, and 36 may be conveniently formed by an oxidation process commonly used for gate dielectrics. In the alternative, a dielectric may be deposited over well regions 20, 22, and 24 and isolation regions 14, 16, and 18. In addition, dielectrics over the well regions do not have to be the same thickness. Conductive layer 26 may be polysilicon. Another conductor type may be found to be effective as well.

Figure 3:
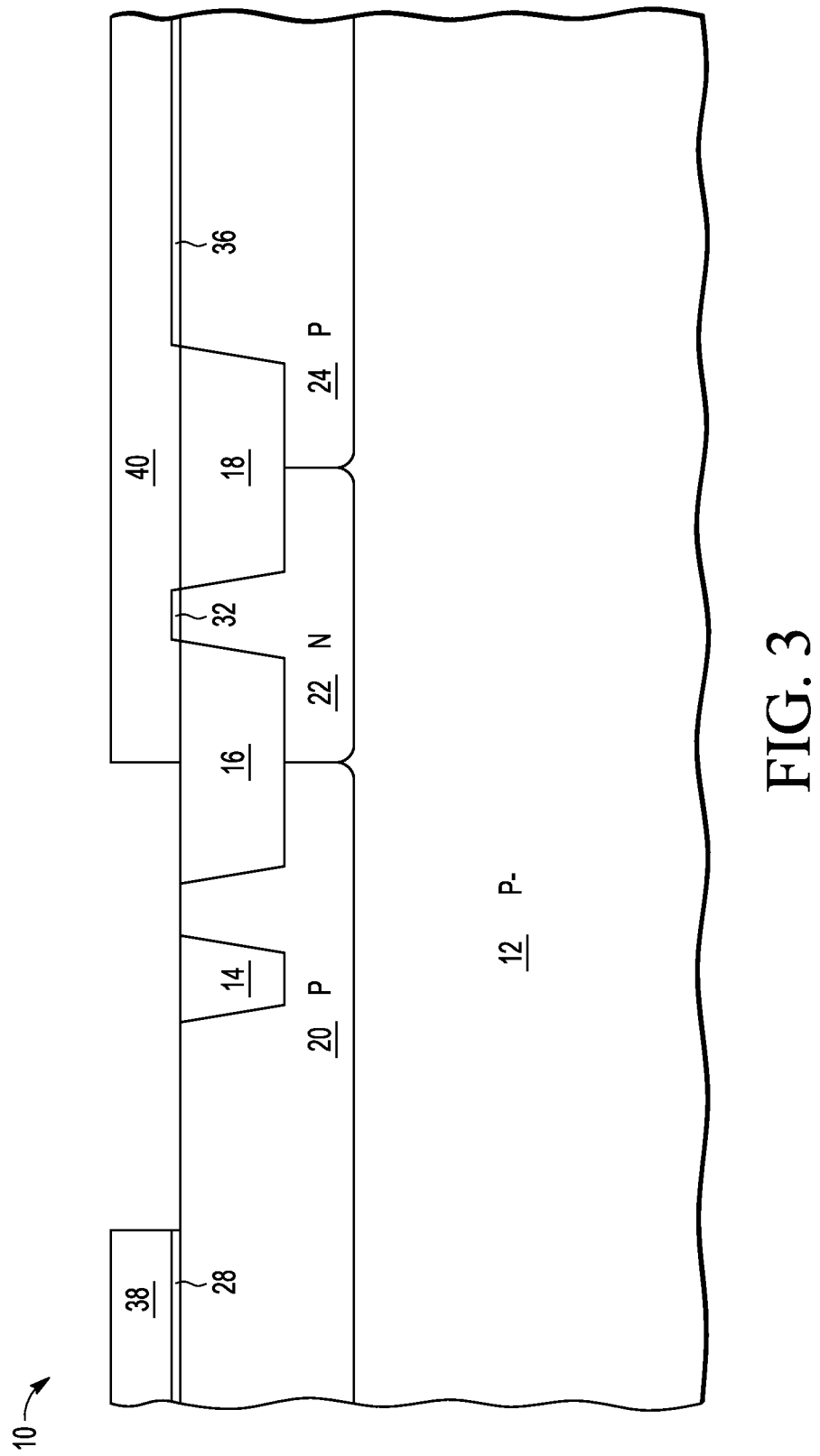
FIG. 3 is the device structure of FIG. 2 at a subsequent stage in processing.

Shown in FIG. 3 is device structure 10 after a patterned etch of conductive layer 26 to leave a portion 38 of conductive layer 26 over well region 20 and spaced from isolation region 14 and to leave a portion 40 over a portion of isolation region 16, well region 22, isolation region 18, and well region 24. Also removed is the portion of dielectric 28 under the removed portion of conductive layer 26 and dielectric 30. This leaves an exposed sidewall of portion 38 and an exposed sidewall of portion 40.

Figure 4:
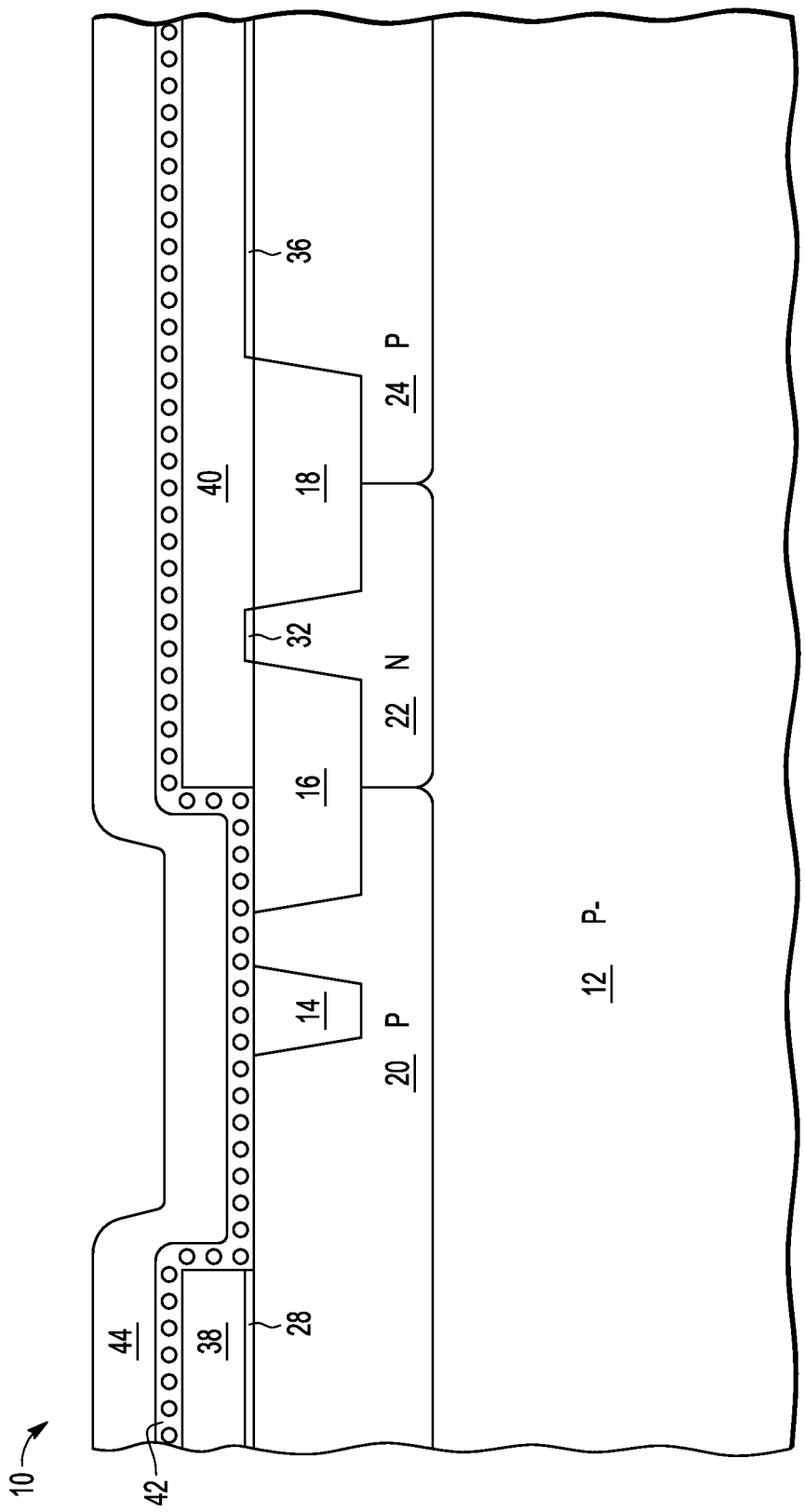
FIG. 4 is the device structure of FIG. 3 at a subsequent stage in processing.

Shown in FIG. 4 is device structure 10 after forming a storage layer 42 over portions 38 and 40, the exposed portion of well region 20, isolation region 14, and the exposed portion of isolation region 16 and after forming a conductive layer 44 on storage layer 42. As shown in FIG. 4, storage layer 42 may be a nanocrystal storage layer in which an insulating layer is deposited, nanocrystals are formed on the insulating layer, and another insulating layer is formed around and over the nanocrystals. Storage layer 42 is for storing charge. Storage layer 42 could be another storage type such as nitride or a polysilicon layer insulated having insulating layers above and below. Conductive layer 44 may be polysilicon but could also be another conductor type as well. Storage layer 42 may also be considered an NVM dielectric stack. Nanocrystals may be formed from polysilicon but other materials may also be found to be effective.

Figure 5:
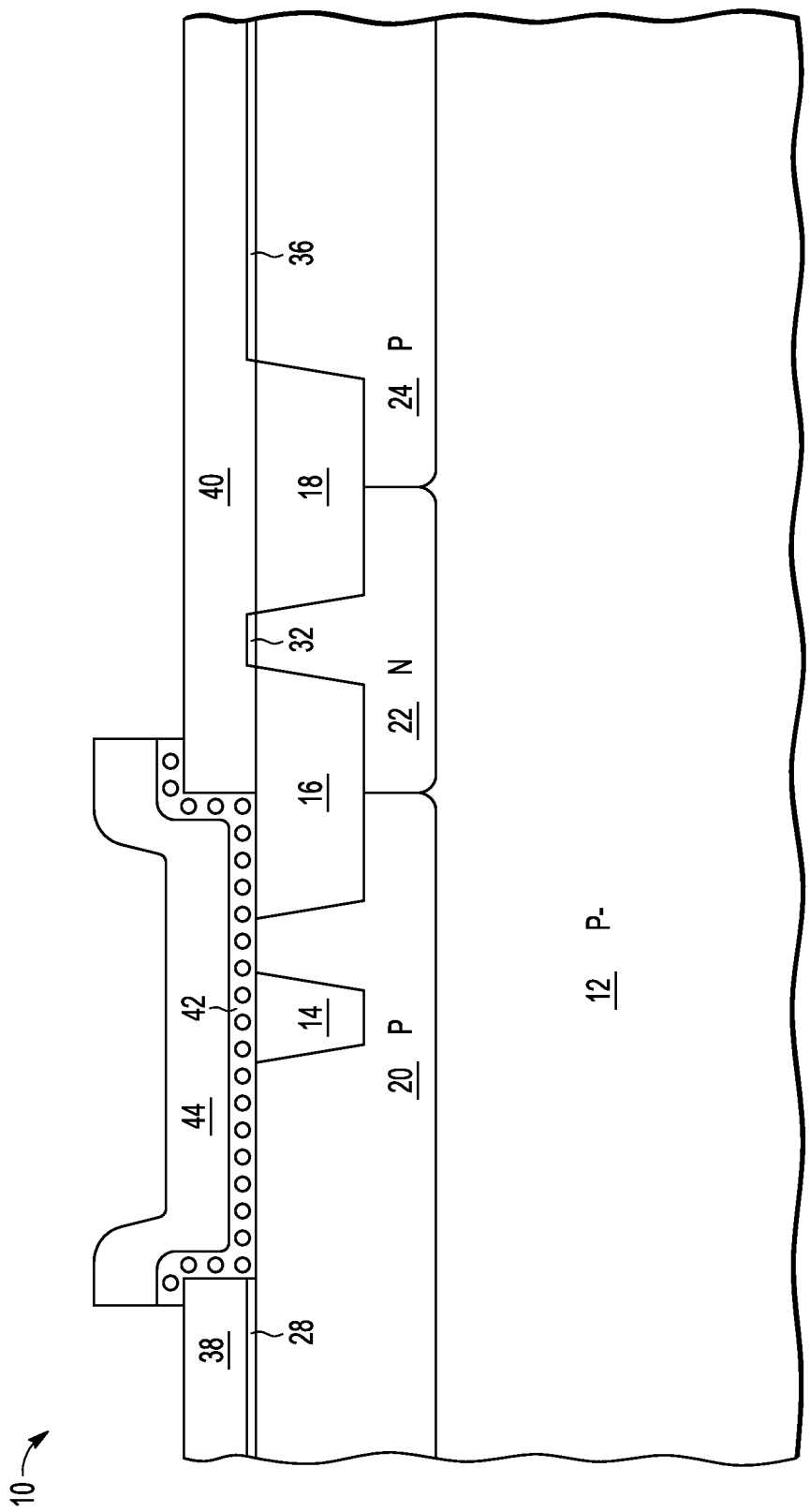
FIG. 5 is the device structure of FIG. 4 at a subsequent stage in processing.

Shown in FIG. 5 is device structure 10 after a patterned etch of conductive layer 44 and storage layer 42 to leave a portion of conductive layer 44 and storage layer 42 between portions 38 and 40 but also overlapping portions 38 and 40. This leaves exposed portions of portions 38 and 40. Storage layer 42 is on isolation region 14, a portion of isolation region 16, well region 20 between isolation regions 14 and 16 and well region 20 between isolation region 14 and portion 38. This leaves an exposed sidewall of conductive layer 44 over portion 38 and an exposed sidewall of conductive layer 44 over portion 40.

Figure 6:
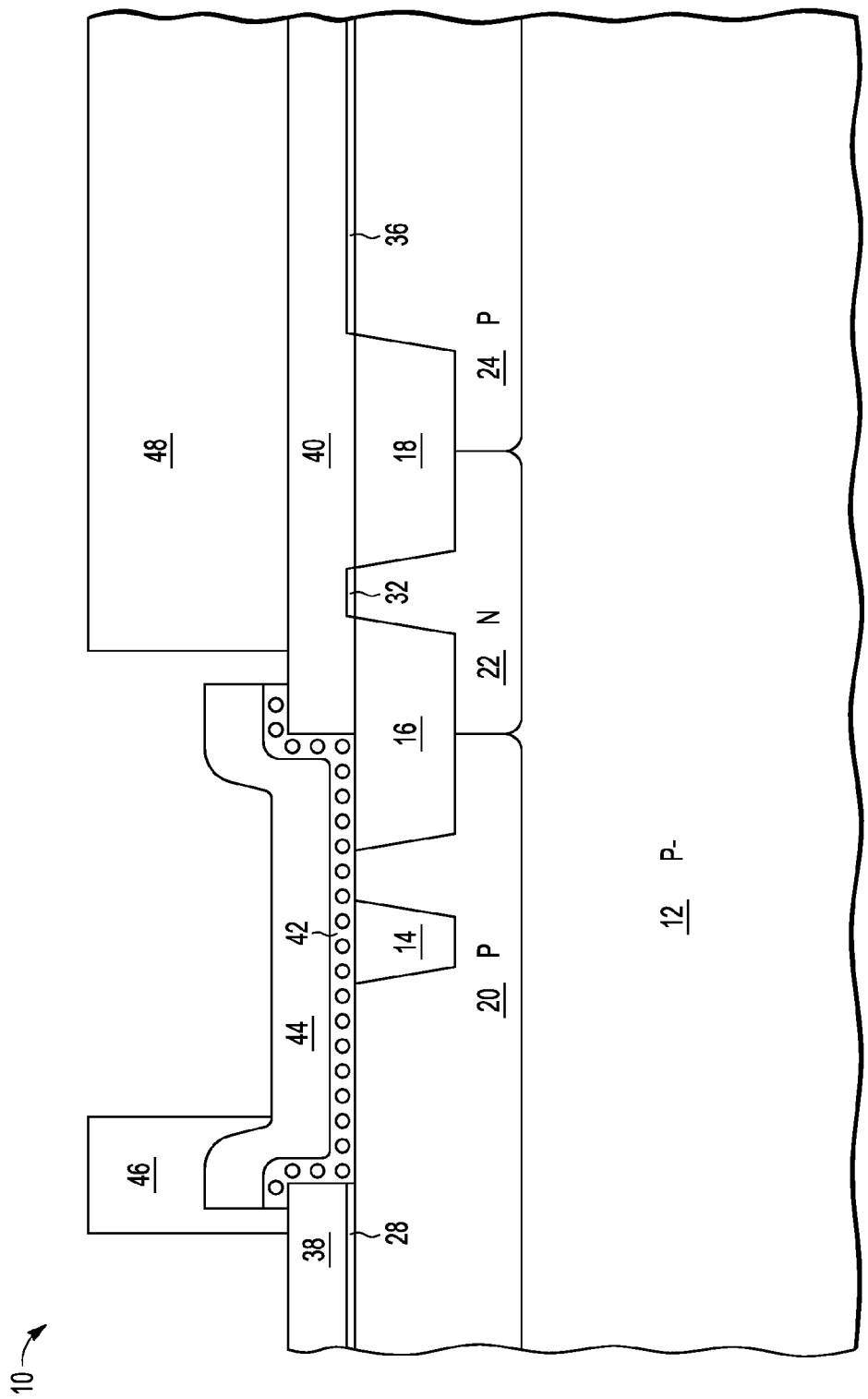
FIG. 6 is the device structure of FIG. 5 at a subsequent stage in processing.

Shown in FIG. 6 is device structure 10 after depositing and patterning photoresist to leave photoresist portion 46 and photoresist portion 48. Photoresist portion 46 may be over the sidewall of conductive layer 44 and is over the sidewall of portion 38. Photoresist portion 48 is over portion 40 in an area spaced from the sidewall of conductive layer 44 that is over portion 40. This exposes a portion of conductive portion 40 between photoresist portion 48 and the sidewall of conductive layer 44 that is over portion 40. A portion of portion 38 is covered by photoresist portion 46 and another portion of portion 38 spaced from conductive layer 44 is exposed.

Figure 7:
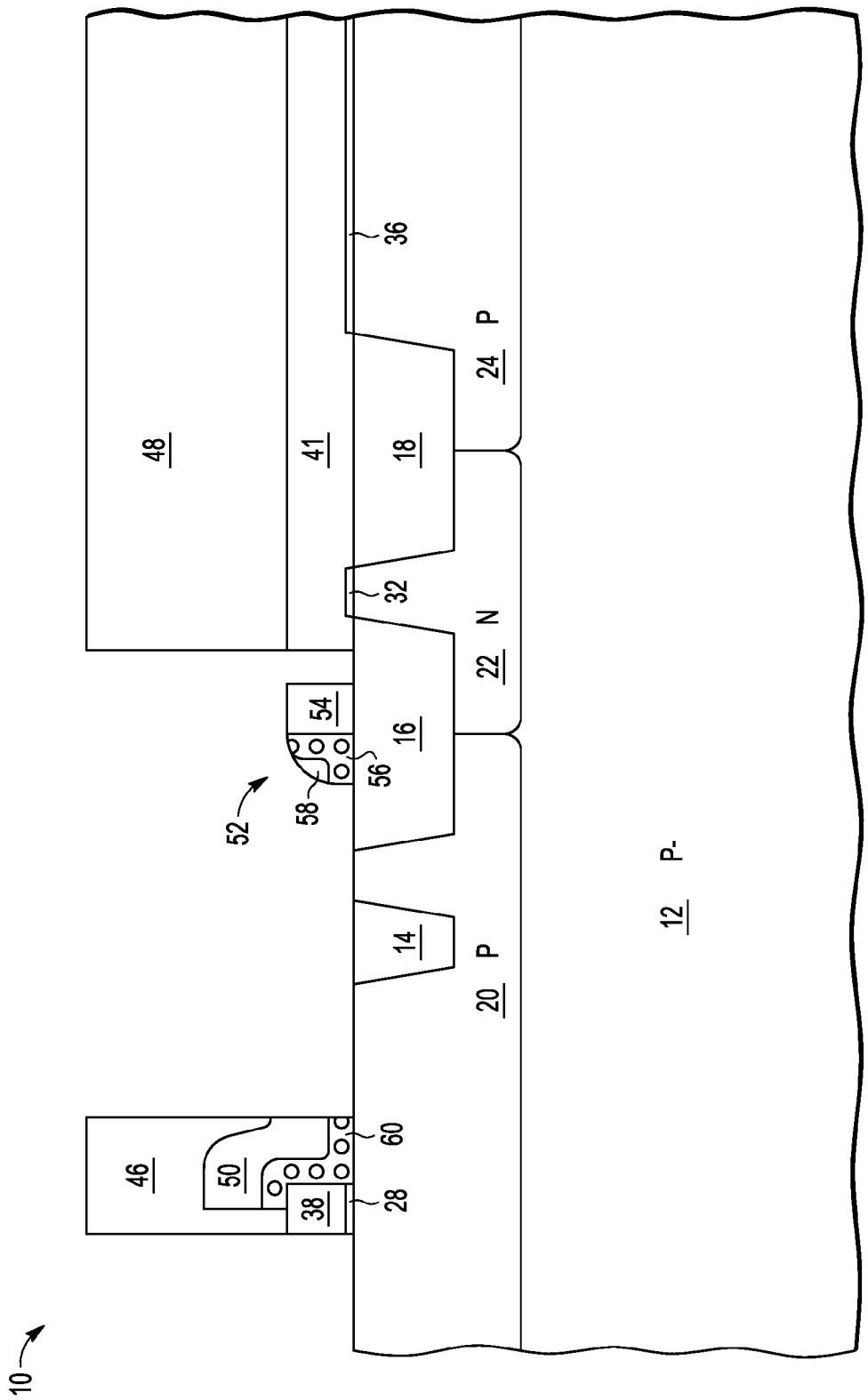
FIG. 7 is the device structure of FIG. 6 at a subsequent stage in processing.

Shown in FIG. 7 is device structure 10 after performing an etch using photoresist portions 46 and 48 as a mask. This etch removes portions 38 and 40 where they are exposed, and conductive layer 44 where it is exposed except a small portion 58 that is formed like a sidewall spacer. The remaining portion of portion 38 as shown in FIG. 7 is for use as a select gate and may be referenced as select gate 38. Due to the total height of conductor layer 44 being approximately double that of portion 40 prior to etching, a sidewall spacer poly 58 is left in etching a portion of conductor layer 44. The unexposed portion of conductive layer 44, which is under photoresist portion 46, remains as portion 50. Removing the exposed portion of portion 40 leaves a portion 41 under photoresist portion 48 and a portion 54 that was under conductive layer 44 prior to the etch. A portion 60 of storage layer 42 is under portion 50. Portion 50 as shown in FIG. 7 is for use as a control gate and may be referenced as control gate 50. A portion 56 of storage layer 42 is between portions 54 and 58 and between portion 58 and isolation region 16. Portions 54, 56, and 58 form a structure 52 that is repeatable.

Due to the various etches that are separately done because of different issues related to the etches, there has been previously an unintended remaining structure in patterning the control gate. This remaining structure typically had a portion of a second polysilicon layer. The result was that the remaining structure typically had a ragged appearance and was not repeatable. The inconsistency often resulted in each structure being automatically identified as a defect. The identification as defects resulted in generating so may defect detections that other defects of concern became difficult to find. By being repeatable and having identifiable features as shown in FIG. 7, the automatic detection equipment does not identify the features such as structure 52 as being a defect. Thus, the number of false detections is reduced making it much simpler to identify the true defects. Also the height of two polysilicon layers, which would be a problem, is avoided by structure 52 being only one polysilicon layer height. The height of two polysilicon layers increases the needed photoresist thickness to obtain the needed step coverage. If structure 52 were the height of two polysilicon layers instead of just one, it would make it difficult to obtain the desired photoresist thickness for etching the logic region without extending the distance between structure 52 and the logic region. Structure 52, being the thickness of only one polysilicon layer makes the subsequent photoresist step not adversely impacted by structure allowing the NVM array to be closer to the logic area and thus saving area. This will be apparent in FIGS. 8-12.

In an alternative process sequence to that shown in FIGS. 5-7, the patterning of charge storage layer 42 and conductor 44 as shown in FIG. 5 can be done such that the edge of conductor 40 is instead pulled back to where it is over isolation region 14. The subsequent etch of conductor 44 is done anisotropically, thus forming a spacer of storage layer 42 and conductor 44 adjacent the exposed sidewall of conductor 40. During the photoresist patterning step similar to that shown in FIG. 6, the photoresist portion 48 would extend further to cover the formed spacer structure as well as the substrate region between isolation regions 14 and 16. Following the etch similar to that shown in FIG. 7, a structure similar to structure 52 shown in FIG. 7 is realized.

Figure 8:
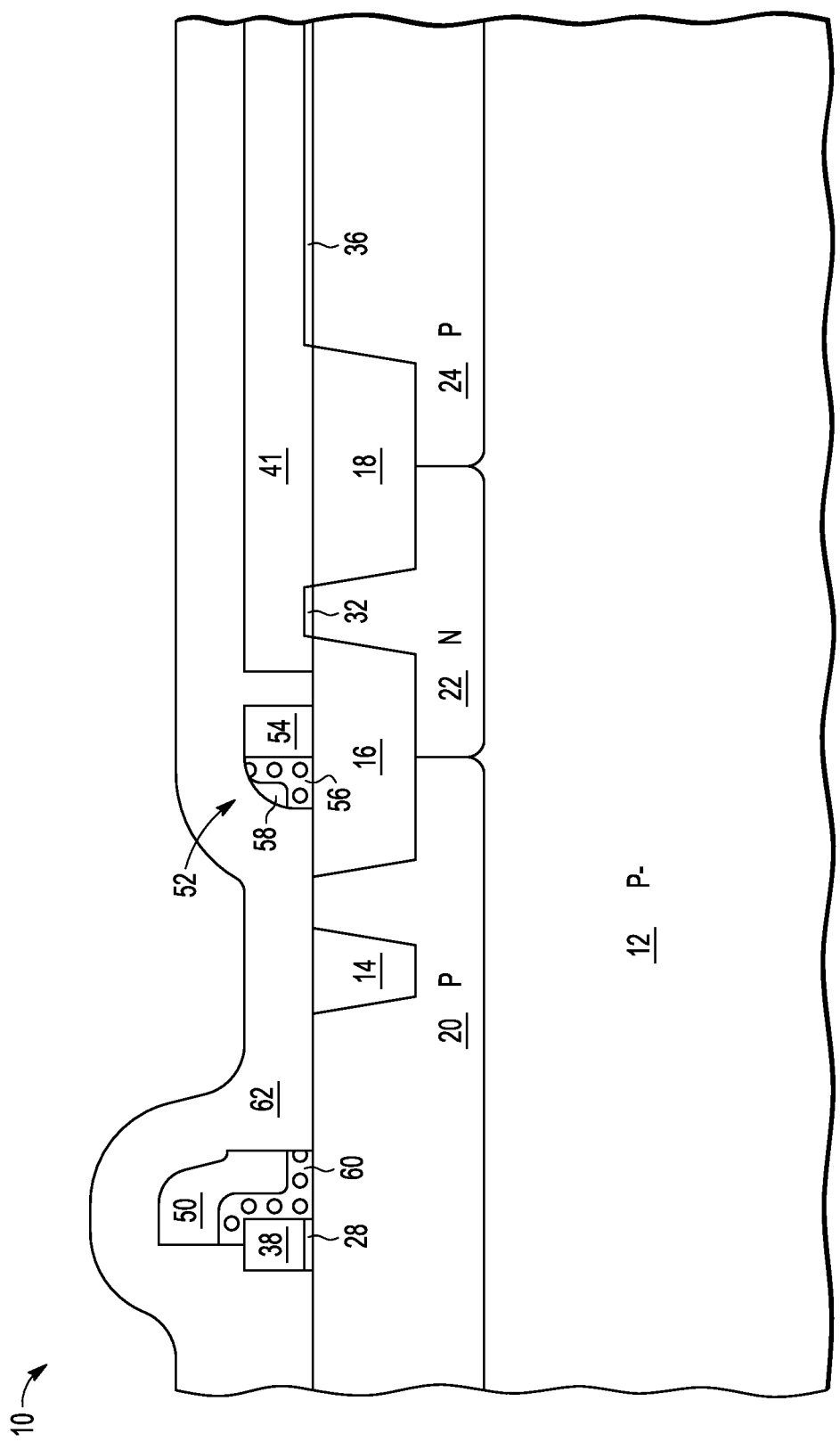
FIG. 8 is the device structure of FIG. 7 at a subsequent stage in processing.

Shown in FIG. 8 is device structure 10 after depositing a photoresist layer 62 that is sufficiently thick to cover control gate 50. With structure 52 and portion 41 being the same height, photoresist layer 62 is substantially the same thickness in the region over them.

Figure 9:
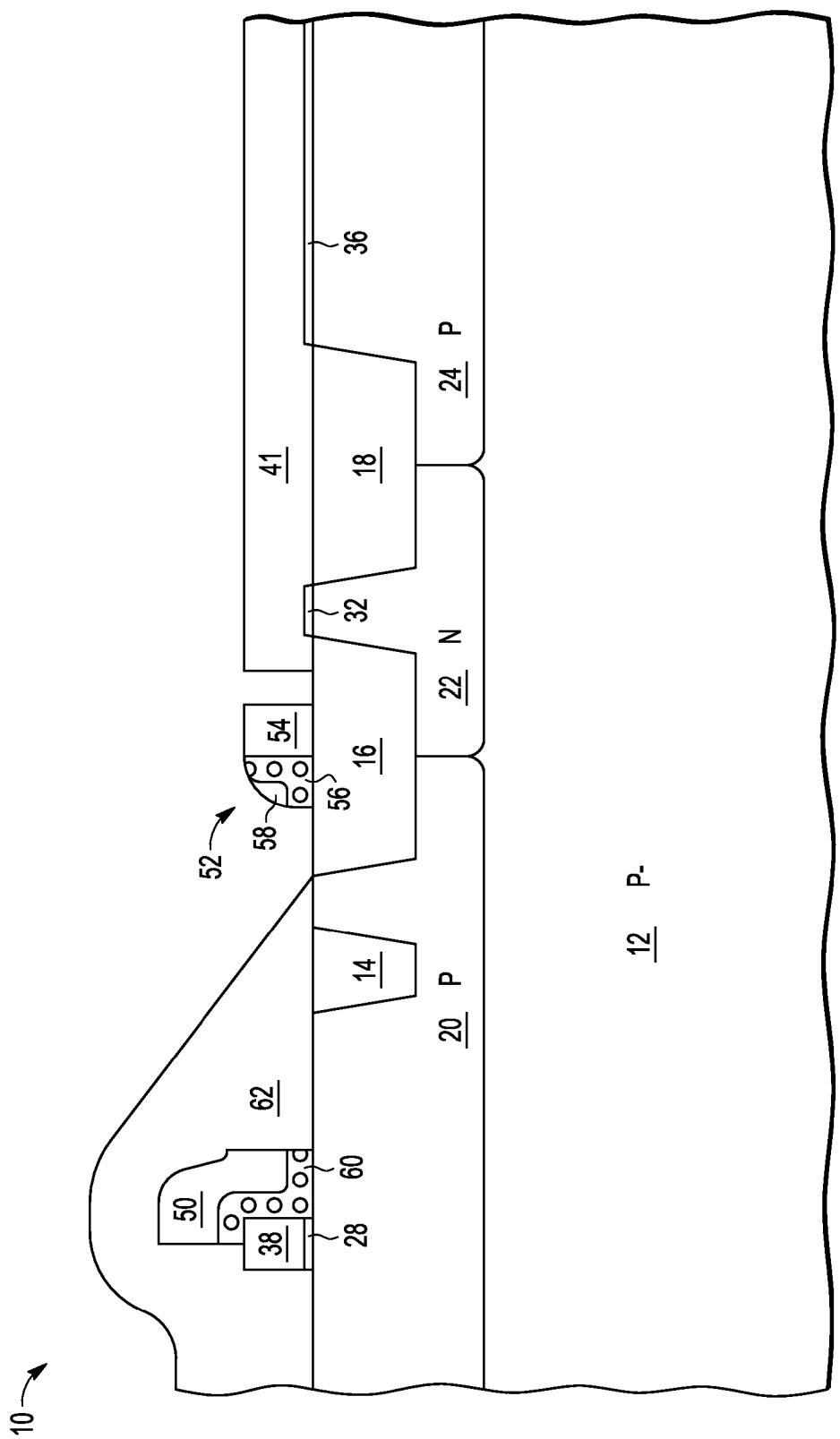
FIG. 9 is the device structure of FIG. 8 at a subsequent stage in processing.

Shown in FIG. 9 is device structure 10 after removing photoresist layer 62 over structure 52 and portion 41. Due to the processing involved with photoresist layer 62, there is some flow so that photoresist layer 62 gradually slopes from control gate 50 to the area where photoresist layer 62 was removed.

Figure 10:
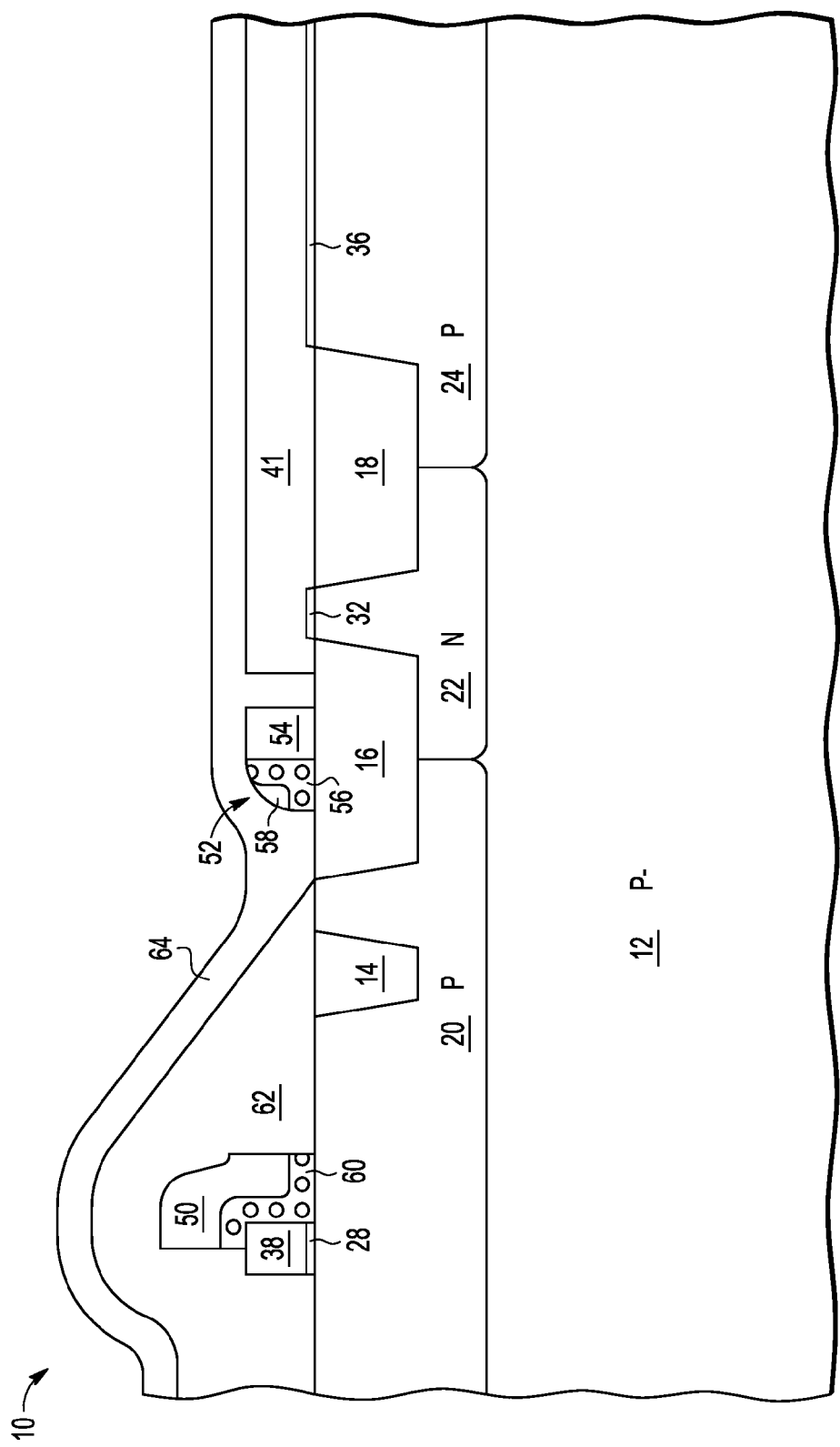
FIG. 10 is the device structure of FIG. 9 at a subsequent stage in processing.

Shown in FIG. 10 is device structure 10 after depositing a photoresist layer 64 over photoresist layer 62, over structure 52, and over portion 41. This shows that photoresist layer 64 is at thickness that is optimized for patterning portion 41 which is likely to have very tight dimension requirements. Photoresist layer 64 is relatively thin compared to photoresist layer 62.

Figure 11:
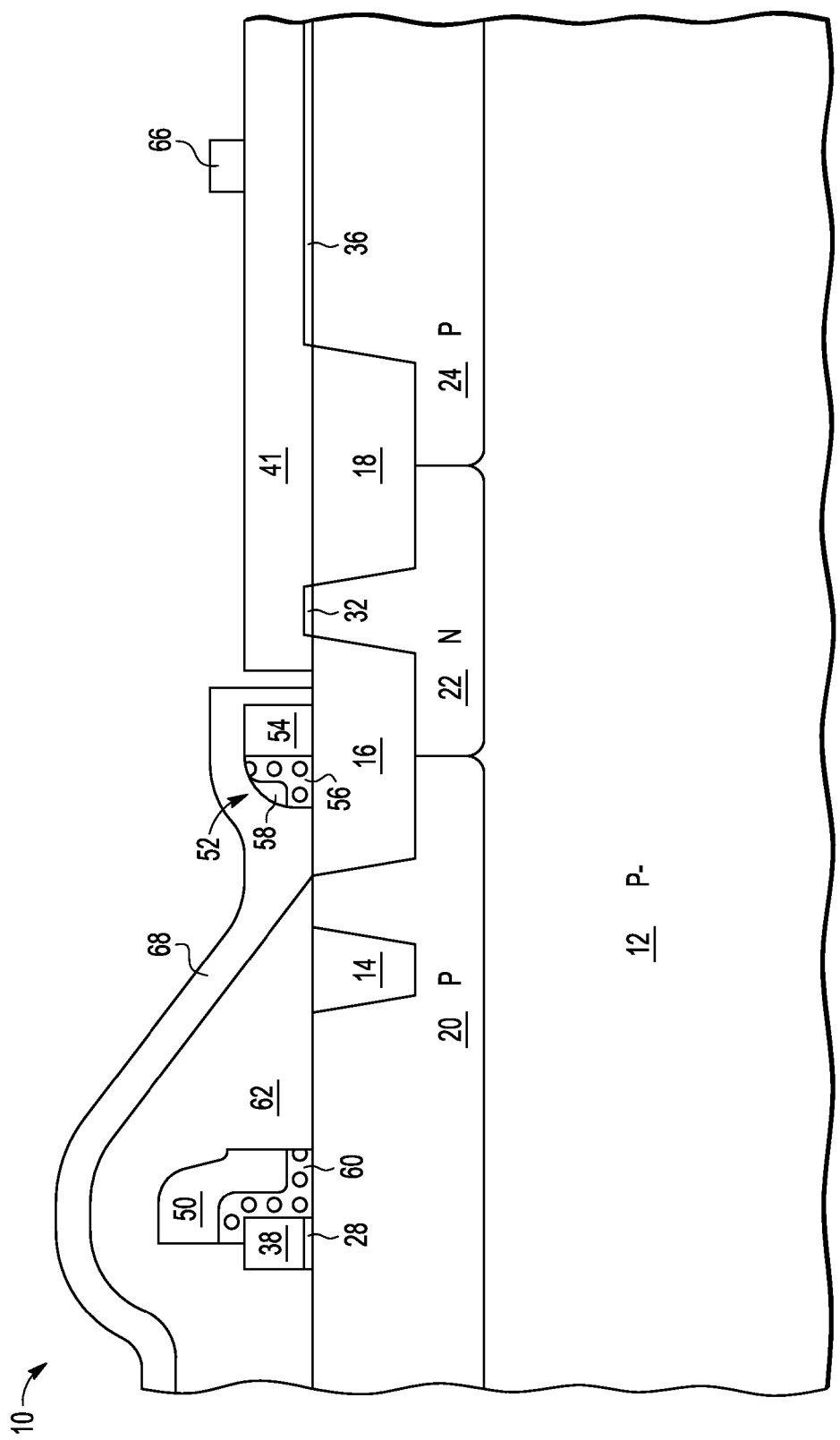
FIG. 11 is the device structure of FIG. 10 at a subsequent stage in processing.

Shown in FIG. 11 is device structure 10 after patterning photoresist layer 64 to leave a photoresist portion 66 for patterning portion 41 and a portion 68 over structure 52 and the remaining portion of photoresist layer 62.

Figure 12:
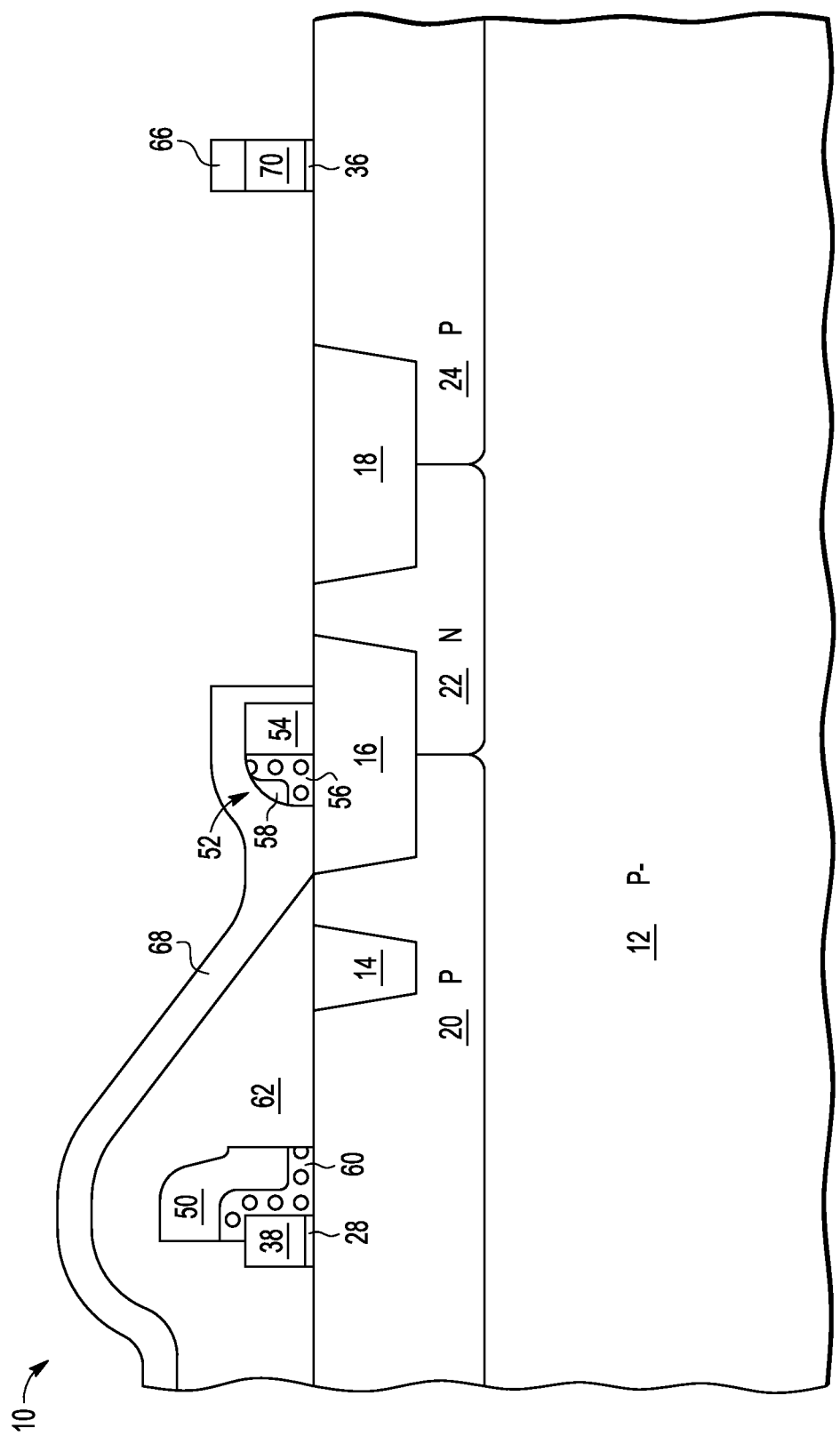
FIG. 12 is the device structure of FIG. 11 at a subsequent stage in processing.

Shown in FIG. 12 is device structure 10 after an etch of portion 41 using photoresist portion 66 as a mask to leave a portion 70 of conductive material which may be polysilicon. This was originally deposited as conductive layer 26.

Figure 13:
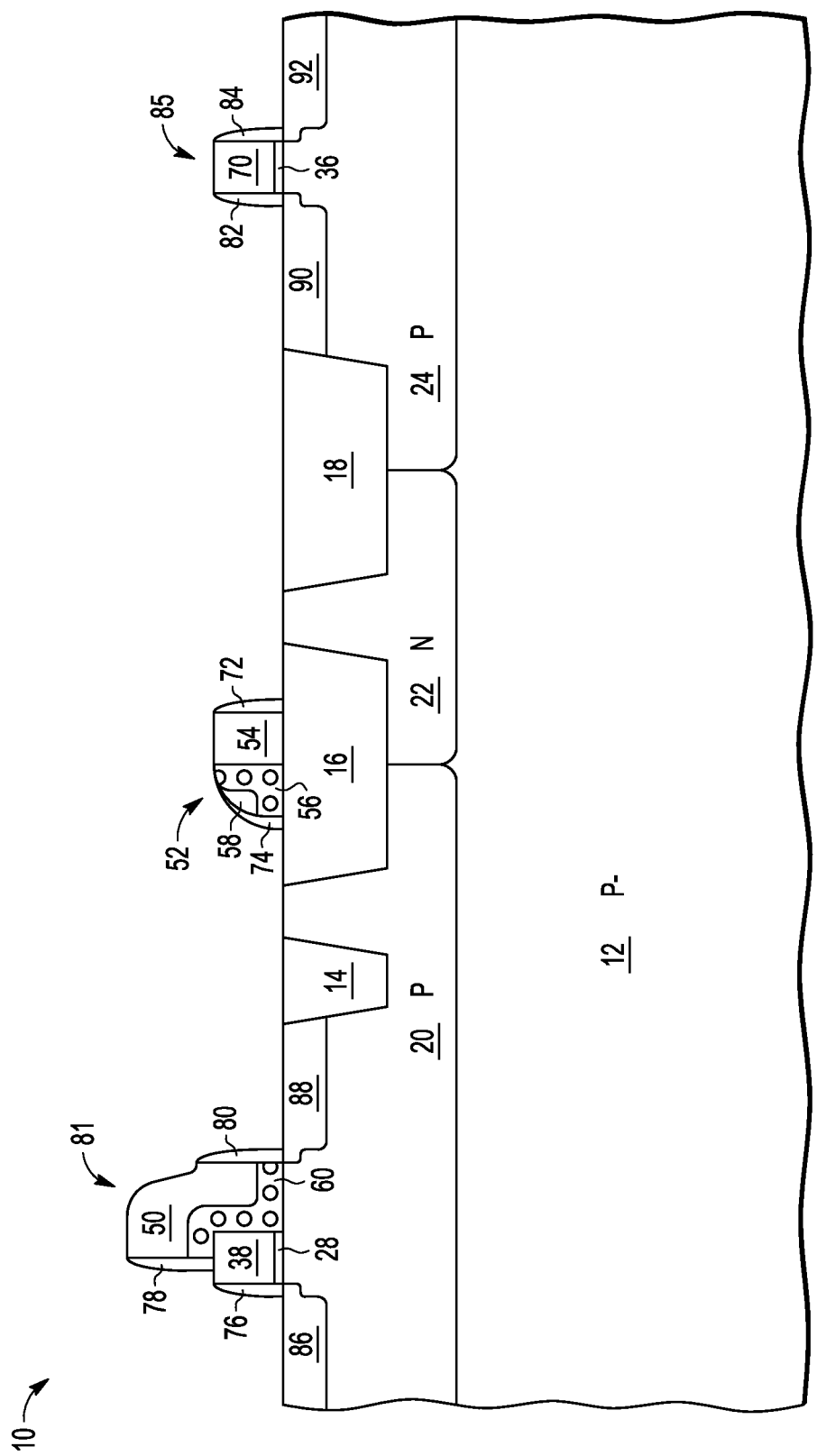
FIG. 13 is the device structure of FIG. 12 at a subsequent stage in processing.

Shown in FIG. 13 is device structure 10 after additional processing to obtain an NVM cell 81 having select gate 38, control gate 50, a portion 60 of charge storage layer 42, a sidewall spacer having a portion 76 adjacent to select gate 38 and a portion 80 adjacent to control gate 50, a drain 86 in well 20, a source 88 in well 20, and a sidewall spacer 78 adjacent to control gate 50. Structure 52 is surrounded by a sidewall spacer having a portion 74 adjacent to portion 58 and portion 72 adjacent to portion 54. Also obtained is a transistor 85 having a gate as portion 70 of conductive material, a sidewall spacer having a portion 82 and a portion 84, a source/drain 90, and a source/drain 92.

The semiconductor substrate described herein can be any semiconductor material or combinations of materials, such as gallium arsenide, silicon germanium, silicon-on-insulator (SOI), silicon, monocrystalline silicon, the like, and combinations of the above.

By now it should be appreciated that there has been provided a method for integrating a non-volatile memory (NVM). The method includes forming a first conductive layer over a substrate, the substrate having an NVM region and an isolation region adjacent the NVM region. The method further includes patterning the first conductive layer to expose at least a portion of the substrate to leave exposed substrate in the NVM region and at least a portion of the isolation region to leave exposed isolation region. The method further includes forming an NVM dielectric stack over the first conductive layer, the exposed substrate, and the exposed isolation region. The method further includes forming a second conductive layer over the NVM dielectric stack. The method further includes patterning the first conductive layer, the NVM dielectric stack, and the second conductive layer to form. The patterning the first conductive layer forms a first gate and a second gate of an NVM cell over the substrate in the NVM region, wherein the first gate is formed from the first conductive layer and the second gate is formed from the second conductive layer and a feature over the isolation region, wherein the feature comprises a portion of the first conductive layer, a portion of the NVM dielectric stack adjacent a first sidewall of the portion of the first conductive layer, and a portion of the second conductive layer adjacent the portion of the NVM dielectric stack. The method may have a further characterization by which the substrate has a logic region adjacent to the isolation region and after the step of patterning the first conductive layer, the NVM dielectric stack, and the second conductive layer to form the first and second gates of the NVM cell and the feature and further include patterning the first conductive layer in the logic region to form at least one gate of a logic device. The method may have a further characterization by which the at least one gate of the logic device and the feature have a same height. The method may have a further characterization by which the step of patterning the first conductive layer, the NVM dielectric stack, and the second conductive layer further includes performing a first etch to form a first sidewall of the second conductive layer over the first conductive layer in the NVM region and a second sidewall of the second conductive layer over the first conductive layer over the isolation region and performing a second etch to form the first gate from the first conductive layer in the NVM region, the second gate from the second conductive layer in the NVM region, and the portion of the first conductive layer over the isolation region, wherein the second gate overlaps a sidewall of the first gate. The method may have a further characterization by which the step of performing the second etch removes portions of the second conductive layer and the NVM dielectric stack from a top surface of the portion of the first conductive layer. The method may have a further characterization by which. The method may have a further characterization by which during the steps of performing the first etch and the second etch, the first conductive layer remains over the substrate in the logic region. The method may have a further characterization by which the step of patterning the first conductive layer, the NVM dielectric stack, and the second conductive layer includes performing an anisotropic etch to pattern the second conductive layer in the NVM region, to form the portion of the NVM dielectric stack of the feature over the isolation region, and to form the portion of the second conductive layer of the feature over the isolation region, wherein the anisotropic etch removes portions of the second conductive layer and the NVM dielectric stack from a top surface of the portion of the first conductive layer and. The method may have a further characterization by which performing a subsequent etch to form the first gate from the first conductive layer in the NVM region, the second gate from the second conductive layer in the NVM region, and the portion of the first conductive layer over the isolation region. The method may have a further characterization by which the feature includes no portion of the second conductive layer over a top surface of the portion of the first conductive layer. The method may further comprise forming a first sidewall spacer adjacent the feature, wherein the first sidewall spacer is adjacent the portion of the second conductive layer and immediately adjacent a second sidewall of the portion of the first conductive layer, wherein the second sidewall of the portion of the first conductive layer is opposite the first sidewall of the portion of the first conductive layer. The method may further include forming a second sidewall spacer adjacent the first gate of the NVM cell and the second gate of the NVM cell.

Also disclosed is a method for integrating a non-volatile memory (NVM). The method includes forming a first conductive layer over a substrate, the substrate having an NVM region, a logic region, and an isolation region between the NVM region and the logic region. The method further includes performing a first etch to form a first portion of the first conductive layer over the substrate in the NVM region and a second portion of the first conductive layer over the substrate in the logic region and extending over the isolation region, wherein the performing the first etch exposes at least a portion of the substrate in the NVM region to leave an exposed NVM region and at least a portion of the isolation region to leave an exposed isolation region. The method further includes forming an NVM dielectric stack over the first portion of the first conductive layer, over the second portion of the first conductive layer, and over the exposed NVM region and the exposed isolation region. The method further includes forming a second conductive layer over the NVM dielectric stack. The method further includes performing a second etch to form a first portion of the second conductive layer which overlies the exposed NVM region and the exposed isolation region, which overlaps a sidewall of the first portion of the first conductive layer in the NVM region, and which overlaps a sidewall of the second portion of the first conductive layer over the isolation region. The method further includes performing a third etch to form a select gate and a control gate of an NVM cell over the substrate in the NVM region, wherein the select gate is formed from the first portion of the first conductive layer and comprises the sidewall of the first portion of the first conductive layer and the control gate is formed from the second conductive layer and overlaps the sidewall of the first portion of the first conductive layer and to form a feature over the isolation region, wherein the feature comprises a third portion of the first conductive layer formed from the second portion of the first conductive layer, a portion of the NVM dielectric stack laterally adjacent a first sidewall of the third portion of the first conductive layer, and a second portion of the second conductive layer adjacent the portion of the NVM dielectric stack. The method further includes after performing the third etch, performing a fourth etch to form at least one gate of a logic device from the second portion of the first conductive layer in the logic region. The method may have a further characterization by which the third portion of the first conductive layer of the feature does not extend into the logic region. The method may have a further characterization by which during the third etch, the first conductive layer in the logic region is protected by a masking layer and during the second etch, the second conductive layer is removed in the logic region. The method may have a further characterization by which the step of performing the third etch removes portions of the second conductive layer and the NVM dielectric stack from a top surface of the third portion of the first conductive layer. The method may have a further characterization by which the feature includes no portion of the second conductive layer over a top surface of the third portion of the first conductive layer. The method may further comprise forming a first sidewall spacer adjacent the feature, wherein the first sidewall spacer is adjacent the second portion of the second conductive layer and immediately adjacent a second sidewall of the third portion of the first conductive layer, wherein the second sidewall of the third portion of the first conductive layer is opposite the first sidewall of the third portion of the first conductive layer.

Disclosed also is an integrated circuit having an integrated non-volatile memory (NVM). The integrated circuit includes an NVM region and an isolation region adjacent the NVM region. The integrated circuit further includes an NVM array in the NVM region, wherein the NVM array comprises an NVM cell having a select gate, an NVM dielectric stack over the select gate, and a control gate over the NVM dielectric stack. The integrated circuit further includes a repeatable feature over the isolation region, spaced apart from the NVM array, wherein the repeatable feature includes a first conductive portion formed from a same conductive layer as the select gate, a dielectric portion formed from a same dielectric stack layer as the NVM dielectric stack and laterally adjacent only a first sidewall of the first conductive portion, and a second conductive portion formed from a same conductive layer as the control gate and laterally adjacent the dielectric portion, wherein the dielectric portion is between the second conductive portion and the first conductive portion. The integrated circuit may further includes a logic region, wherein the isolation region is between the NVM region and the logic region, and a logic device formed in and over the substrate in the logic region, wherein a gate of the logic device is formed from a same conductive layer as the select gate and the first conductive portion, wherein the gate of the logic device, the select gate, and the first conductive portion all have a same height. The integrated circuit may further include an insulating layer over and in physical contact with a top surface of the first conductive portion of the repeatable feature. The method may have a further characterization by which the repeatable feature further comprises a sidewall spacer laterally adjacent the second conductive portion and immediately laterally adjacent a second sidewall of the first conductive portion, wherein the second sidewall of the first conductive portion is opposite the first sidewall of the first conductive portion.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different materials than those described may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for integrating a non-volatile memory (NVM), the method comprising:
    forming a first conductive layer over a substrate, the substrate having an NVM region, a logic region, and an isolation region, wherein the isolation region is adjacent the NVM region and the logic region;
    patterning the first conductive layer to expose at least a portion of the substrate to leave exposed substrate in the NVM region and at least a portion of the isolation region to leave exposed isolation region;
    forming an NVM dielectric stack over the first conductive layer, the exposed substrate, and the exposed isolation region;
    forming a second conductive layer over the NVM dielectric stack; and
    patterning the first conductive layer, the NVM dielectric stack, and the second conductive layer to form:
        a first gate and a second gate of an NVM cell over the substrate in the NVM region, wherein the first gate is formed from the first conductive layer and the second gate is formed from the second conductive layer, and
        a feature over the isolation region, wherein the feature comprises a portion of the first conductive layer, a portion of the NVM dielectric stack adjacent a first sidewall of the portion of the first conductive layer, and a portion of the second conductive layer adjacent the portion of the NVM dielectric stack; and
    after the step of patterning the first conductive layer, the NVM dielectric stack, and the second conductive layer to form the first and second gates of the NVM cell and the feature, the method further comprises:
    patterning the first conductive layer in the logic region to form at least one gate of a logic device.

2. The method of claim 1, wherein the at least one gate of the logic device and the feature have a same height.

3. The method of claim 1, wherein the feature includes no portion of the second conductive layer over a top surface of the portion of the first conductive layer.

4. The method of claim 1, further comprising:
    forming a first sidewall spacer adjacent the feature, wherein the first sidewall spacer is adjacent the portion of the second conductive layer and immediately adjacent a second sidewall of the portion of the first conductive layer, wherein the second sidewall of the portion of the first conductive layer is opposite the first sidewall of the portion of the first conductive layer.

5. The method of claim 4, further comprising:
    forming a second sidewall spacer adjacent the first gate of the NVM cell and the second gate of the NVM cell.

6. A method for integrating a non-volatile memory (NVM), the method comprising:
    forming a first conductive layer over a substrate, the substrate having an NVM region and an isolation region adjacent the NVM region;

patterning the first conductive layer to expose at least a portion of the substrate to leave exposed substrate in the NVM region and at least a portion of the isolation region to leave exposed isolation region;

forming an NVM dielectric stack over the first conductive layer, the exposed substrate, and the exposed isolation region;

forming a second conductive layer over the NVM dielectric stack; and patterning the first conductive layer, the NVM dielectric stack, and the second conductive layer to form:

a first gate and a second gate of an NVM cell over the substrate in the NVM region, wherein the first gate is formed from the first conductive layer and the second gate is formed from the second conductive layer, and a feature over the isolation region, wherein the feature comprises a portion of the first conductive layer, a portion of the NVM dielectric stack adjacent a first sidewall of the portion of the first conductive layer, and a portion of the second conductive layer adjacent the portion of the NVM dielectric stack; and wherein the step of patterning the first conductive layer, the NVM dielectric stack, and the second conductive layer comprises:

performing a first etch to form a first sidewall of the second conductive layer over the first conductive layer in the NVM region and a second sidewall of the second conductive layer over the first conductive layer over the isolation region; and performing a second etch to form the first gate from the first conductive layer in the NVM region, the second gate from the second conductive layer in the NVM region, and the portion of the first conductive layer over the isolation region, wherein the second gate overlaps a sidewall of the first gate.

7. The method of claim 6, wherein the step of performing the second etch removes portions of the second conductive layer and the NVM dielectric stack from a top surface of the portion of the first conductive layer.

8. The method of claim 7, wherein during the steps of performing the first etch and the second etch, the first conductive layer remains over the substrate in the logic region.

9. A method for integrating a non-volatile memory (NVM), the method comprising:

forming a first conductive layer over a substrate, the substrate having an NVM region and an isolation region adjacent the NVM region;

patterning the first conductive layer to expose at least a portion of the substrate to leave exposed substrate in the NVM region and at least a portion of the isolation region to leave exposed isolation region;

forming an NVM dielectric stack over the first conductive layer, the exposed substrate, and the exposed isolation region;

forming a second conductive layer over the NVM dielectric stack; and patterning the first conductive layer, the NVM dielectric stack, and the second conductive layer to form:

a first gate and a second gate of an NVM cell over the substrate in the NVM region, wherein the first gate is formed from the first conductive layer and the second gate is formed from the second conductive layer, and a feature over the isolation region, wherein the feature comprises a portion of the first conductive layer, a portion of the NVM dielectric stack adjacent a first sidewall of the portion of the first conductive layer, and a portion of the second conductive layer adjacent the portion of the NVM dielectric stack; and wherein the step of patterning the first conductive layer, the NVM dielectric stack, and the second conductive layer comprises:

performing an anisotropic etch to pattern the second conductive layer in the NVM region, to form the portion of the NVM dielectric stack of the feature over the isolation region, and to form the portion of the second conductive layer of the feature over the isolation region, wherein the anisotropic etch removes portions of the second conductive layer and the NVM dielectric stack from a top surface of the portion of the first conductive layer; and performing a subsequent etch to form the first gate from the first conductive layer in the NVM region, the second gate from the second conductive layer in the NVM region, and the portion of the first conductive layer over the isolation region.

10. A method for integrating a non-volatile memory (NVM), the method comprising:

forming a first conductive layer over a substrate, the substrate having an NVM region, a logic region, and an isolation region between the NVM region and the logic region;

performing a first etch to form a first portion of the first conductive layer over the substrate in the NVM region and a second portion of the first conductive layer over the substrate in the logic region and extending over the isolation region, wherein the performing the first etch exposes at least a portion of the substrate in the NVM region to leave an exposed NVM region and at least a portion of the isolation region to leave an exposed isolation region;

forming an NVM dielectric stack over the first portion of the first conductive layer, over the second portion of the first conductive layer, and over the exposed NVM region and the exposed isolation region;

forming a second conductive layer over the NVM dielectric stack;

performing a second etch to form a first portion of the second conductive layer which overlies the exposed NVM region and the exposed isolation region, which overlaps a sidewall of the first portion of the first conductive layer in the NVM region, and which overlaps a sidewall of the second portion of the first conductive layer over the isolation region;

performing a third etch to form:

a select gate and a control gate of an NVM cell over the substrate in the NVM region, wherein the select gate is formed from the first portion of the first conductive layer and comprises the sidewall of the first portion of the first conductive layer and the control gate is formed from the second conductive layer and overlaps the sidewall of the first portion of the first conductive layer, and a feature over the isolation region, wherein the feature comprises a third portion of the first conductive layer formed from the second portion of the first conductive layer, a portion of the NVM dielectric stack laterally adjacent a first sidewall of the third portion of the first conductive layer, and a second portion of the second conductive layer adjacent the portion of the NVM dielectric stack; and after performing the third etch, performing a fourth etch to form at least one gate of a logic device from the second portion of the first conductive layer in the logic region.

11. The method of claim 10, wherein the third portion of the first conductive layer of the feature does not extend into the logic region.

12. The method of claim 10, wherein during the third etch, the first conductive layer in the logic region is protected by a masking layer and during the second etch, the second conductive layer is removed in the logic region.

13. The method of claim 10, wherein the step of performing the third etch removes portions of the second conductive layer and the NVM dielectric stack from a top surface of the third portion of the first conductive layer.

14. The method of claim 10, wherein the feature includes no portion of the second conductive layer over a top surface of the third portion of the first conductive layer.

15. The method of claim 10, further comprising:
forming a first sidewall spacer adjacent the feature, wherein the first sidewall spacer is adjacent the second portion of the second conductive layer and immediately adjacent a second sidewall of the third portion of the first conductive layer, wherein the second sidewall of the third portion of the first conductive layer is opposite the first sidewall of the third portion of the first conductive layer.

* * * * *